United States Patent
Chung et al.

(10) Patent No.: US 9,984,983 B2
(45) Date of Patent: May 29, 2018

(54) SEMICONDUCTOR PACKAGES WITH THERMAL-ENHANCED CONFORMAL SHIELDING AND RELATED METHODS

(71) Applicant: Advanced Semiconductor Engineering, Inc., Kaohsiung (TW)

(72) Inventors: Chi-Sheng Chung, Koahsiung (TW); Kuo-Hsien Liao, Taichung (TW); Jin-Feng Yang, Kaohsiung (TW); Chen-Yin Tai, Chaozhuo Township (TW); Yung-I Yeh, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days. days.

(21) Appl. No.: 15/271,555

(22) Filed: Sep. 21, 2016

(65) Prior Publication Data

US 2017/0012007 A1 Jan. 12, 2017

Related U.S. Application Data

(63) Continuation of application No. 13/779,249, filed on Feb. 27, 2013, now Pat. No. 9,484,313.

(51) Int. Cl.
*H01L 23/60* (2006.01)
*H01L 23/00* (2006.01)
(Continued)

(52) U.S. Cl.
CPC ............ *H01L 23/60* (2013.01); *H01L 21/565* (2013.01); *H01L 21/78* (2013.01);
(Continued)

(58) Field of Classification Search
CPC ....... H01L 21/565; H01L 21/78; H01L 23/60; H01L 23/3121; H01L 23/3675; H01L 24/17; H01L 24/97
See application file for complete search history.

(56) References Cited

U.S. PATENT DOCUMENTS

| 5,557,064 A | 9/1996 | Isern-Flecha et al. |
| 6,596,937 B2 | 7/2003 | Mazurkiewicz |

(Continued)

FOREIGN PATENT DOCUMENTS

| CN | 1774804 | 5/2006 |
| CN | 101840910 | 9/2010 |
| CN | 102074551 | 5/2011 |

OTHER PUBLICATIONS

Office Action on corresponding foreign application (TW Application No. 103106537) from the Taiwan Intellectual Property Office dated Nov. 12, 2015.

(Continued)

*Primary Examiner* — Fazli Erdem
(74) *Attorney, Agent, or Firm* — Klein, O'Neill & Singh, LLP

(57) ABSTRACT

The semiconductor package includes a substrate, a die, a first metal layer, a second metal layer and an optional seed layer. The package body at least partially encapsulates the die on the substrate. The seed layer is disposed on the package body and the first metal layer is disposed on the seed layer. The second metal layer is disposed on the first metal layer and the lateral surface of the substrate. The first metal layer and the second metal layer form an outer metal cap that provides thermal dissipation and electromagnetic interference (EMI) shielding.

23 Claims, 8 Drawing Sheets

(51) Int. Cl.
  *H01L 21/56* (2006.01)
  *H01L 21/78* (2006.01)
  *H01L 23/31* (2006.01)
  *H01L 23/367* (2006.01)

(52) U.S. Cl.
  CPC ...... *H01L 23/3121* (2013.01); *H01L 23/3675* (2013.01); *H01L 24/17* (2013.01); *H01L 24/97* (2013.01); *H01L 2224/16225* (2013.01); *H01L 2224/16227* (2013.01); *H01L 2224/48227* (2013.01); *H01L 2224/97* (2013.01); *H01L 2924/12042* (2013.01); *H01L 2924/15313* (2013.01); *H01L 2924/181* (2013.01); *H01L 2924/19015* (2013.01); *H01L 2924/19105* (2013.01); *H01L 2924/3025* (2013.01)

(56) References Cited

U.S. PATENT DOCUMENTS

| | | | |
|---|---|---|---|
| 6,965,071 B2 | 11/2005 | Watchko et al. | |
| 7,701,728 B2 | 4/2010 | Hatanaka et al. | |
| 8,156,644 B2 | 4/2012 | Babb et al. | |
| 9,001,528 B2 | 4/2015 | Yorita et al. | |
| 2003/0193113 A1 | 10/2003 | Glovatsky | |
| 2004/0020673 A1 | 2/2004 | Mazurkiewicz | |
| 2004/0080041 A1 | 4/2004 | Kimura | |
| 2004/0150102 A1 | 8/2004 | Lee et al. | |
| 2004/0231872 A1* | 11/2004 | Arnold | H01L 23/04 174/377 |
| 2007/0030661 A1 | 2/2007 | Morris et al. | |
| 2008/0145974 A1* | 6/2008 | Freitag | G11B 5/3106 438/122 |
| 2008/0157340 A1 | 7/2008 | Yang et al. | |
| 2008/0179717 A1* | 7/2008 | Wu | H01L 23/552 257/659 |
| 2008/0258293 A1 | 10/2008 | Yang et al. | |
| 2009/0159320 A1 | 6/2009 | Sanjuan et al. | |
| 2009/0256244 A1 | 10/2009 | Liao et al. | |
| 2009/0321898 A1 | 12/2009 | Pagaila et al. | |
| 2010/0013064 A1 | 1/2010 | Hsu | |
| 2010/0032815 A1 | 2/2010 | An et al. | |
| 2010/0108370 A1 | 5/2010 | Kapusta et al. | |
| 2010/0207259 A1 | 8/2010 | Liao et al. | |
| 2010/0230789 A1 | 9/2010 | Yorita et al. | |
| 2010/0276792 A1* | 11/2010 | Chi | H01L 23/29 257/660 |
| 2010/0319981 A1 | 12/2010 | Kapusta et al. | |
| 2011/0090659 A1 | 4/2011 | Liao et al. | |
| 2011/0115060 A1 | 5/2011 | Chiu et al. | |
| 2011/0163457 A1* | 7/2011 | Mohan | H01L 21/4853 257/774 |
| 2011/0248389 A1 | 10/2011 | Yorita et al. | |
| 2011/0298105 A1* | 12/2011 | Chi | H01L 23/29 257/659 |
| 2012/0049347 A1 | 3/2012 | Wang | |
| 2012/0139097 A1 | 6/2012 | Jin et al. | |
| 2012/0171814 A1 | 7/2012 | Choi et al. | |
| 2012/0280374 A1 | 11/2012 | Choi et al. | |
| 2012/0299165 A1* | 11/2012 | Pagaila | H01L 23/147 257/659 |
| 2013/0052775 A1 | 2/2013 | Kim et al. | |
| 2013/0093067 A1 | 4/2013 | Clark et al. | |
| 2013/0105950 A1 | 5/2013 | Bergemont et al. | |
| 2013/0240261 A1 | 9/2013 | Song et al. | |
| 2013/0307128 A1* | 11/2013 | Lin | H01L 23/49805 257/659 |
| 2014/0124907 A1 | 5/2014 | Park | |
| 2014/0252568 A1 | 9/2014 | Hwang et al. | |
| 2014/0319661 A1* | 10/2014 | Pagaila | H01L 23/147 257/659 |
| 2015/0118794 A1 | 4/2015 | Lin et al. | |

OTHER PUBLICATIONS

Office Action on corresponding foreign application (CN Application No. 201410069420.5) from the State Intellectual Property Office of China dated Mar. 29, 2016.

* cited by examiner

SEMICONDUCTOR PACKAGES WITH THERMAL-ENHANCED CONFORMAL SHIELDING AND RELATED METHODS

CROSS-REFERENCE TO RELATED APPLICATIONS

This application is a continuation of co-pending U.S. patent application Ser. No. 13/779,249, filed on Feb. 27, 2013, the disclosure of which is incorporated herein by reference in its entirety.

TECHNICAL FIELD

The present embodiments relate to semiconductor packages and related methods, and more particularly to semiconductor packages with thermal-enhanced conformal shielding and related methods.

DESCRIPTION OF THE RELATED ART

As operation speed increases and device size decreases, semiconductor packages encounter problems with both electromagnetic shielding and thermal dissipation. In particular, higher clock speeds cause more frequent signal transitions between different levels, and increase the intensity of electromagnetic emissions under high frequency or short wavelength. Electromagnetic emissions may radiate from one semiconductor device to an adjacent semiconductor device. Electromagnetic interference (EMI) negatively affects the operation of a semiconductor device if electromagnetic emissions of the adjacent semiconductor device are of higher intensity. If an electronic system has a high-density distribution of semiconductor devices, then the EMI among the semiconductor devices becomes even worse.

Semiconductor devices inherently generate heat during normal operation, and excessive heat build-up can adversely affect the operation of the semiconductor device as well as shorten its lifetime. Accordingly, a need exists for semiconductor packages that have enhanced thermal dissipation and shielding effectiveness without destructively impacting device reliability, safety, longevity, and cost.

SUMMARY

One of the present embodiments comprises a semiconductor package having a substrate with an upper surface, a lower surface opposite the upper surface, and a lateral surface adjacent to a periphery of the substrate and extending between the upper surface and the lower surface. The package further comprises a grounding segment disposed adjacent the periphery of the substrate. The package further comprises a die disposed adjacent to the upper surface of the substrate. The package further comprises a package body disposed adjacent to the upper surface of the substrate and at least partially encapsulating the die. The package further comprises a first metal layer disposed over the package body and the die. The package further comprises a second metal layer disposed on the first metal layer and the lateral surface of the substrate, and electrically connected to the grounding segment.

Another of the present embodiments comprises a semiconductor package having a substrate with an upper surface, a lower surface opposite the upper surface, and a lateral surface adjacent to a periphery of the substrate and extending between the upper surface and the lower surface. The package further comprises a die disposed adjacent to the upper surface of the substrate. The package further comprises a package body disposed adjacent to the upper surface of the substrate and at least partially encapsulating the die. The package further comprises a first metal layer disposed over the package body and the die. The package further comprises a second metal layer having a top portion disposed on the first metal layer and a side portion disposed on the lateral surface of the substrate. A thickness of the first metal layer is at least five times greater than a thickness of the top portion of the second metal layer.

Another of the present embodiments comprises a method for making a semiconductor package. The method comprises providing a substrate having an upper surface and a grounding segment. The method further comprises disposing a plurality of dice adjacent to the upper surface of the substrate. The method further comprises forming a package body on the upper surface of the substrate to encapsulate the die. The method further comprises forming a seed layer on the package body. The method further comprises forming a first metal layer on the seed layer. The method further comprises conducting a singulation process to form a plurality of package units. The method further comprises forming a second metal layer on the first metal layer and the substrate of each of the package units to cover the grounding segment.

BRIEF DESCRIPTION OF THE DRAWINGS

Common reference numerals are used throughout the drawings and the detailed description to indicate the same elements. The present invention will be more apparent from the following detailed description taken in conjunction with the accompanying drawings.

DETAILED DESCRIPTION

Figure 1A:
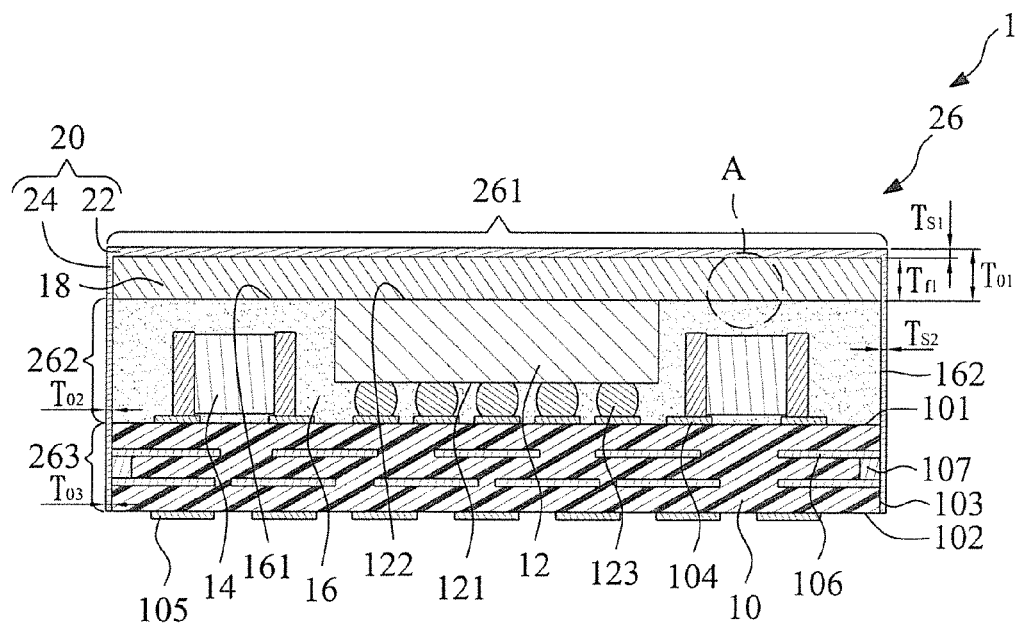
FIG. 1A is a cross-sectional view of a semiconductor package according to one of the present embodiments.

Referring to FIG. 1A, a cross-sectional view of a semiconductor package 1 according to one of the present embodiments is illustrated. The semiconductor package 1 includes a substrate 10, a die 12, at least one passive element 14, a package body 16, a first metal layer 18 and a second metal layer 20.

The substrate 10 has an upper surface 101, a lower surface 102, at least one lateral surface 103, a plurality of upper pads 104, a plurality of lower pads 105, a plurality of circuit layers 106 and at least one grounding segment 107. The lower surface 102 is opposite to the upper surface 101, and the lateral surface 103 is disposed at the periphery of the substrate 10 and extends between the lower surface 102 and the upper surface 101. The upper pads 104 are disposed on the upper surface 101, and the lower pads 105 are disposed on the lower surface 102. The substrate 10 is a multi-layer structure, that is, the circuit layers 106 are disposed inside the substrate 10. The grounding segment 107 may be one or more conductive vias extending between the upper surface 101 and the lower surface 102. Alternatively, the grounding segment 107 is a portion of the circuit layers 106. In this embodiment, the grounding segment 107 is electrically connected to a ground potential and exposed at the lateral surface 103 to provide a ground connection.

The die 12 and the passive elements 14 are attached to the upper pads 104 on the upper surface 101 of the substrate 10. In this embodiment, the die 12 has an active surface 121, a backside surface 122 and a plurality of bumps 123. The bumps 123 are disposed on the active surface 121 and connected to the upper pads 104. Thus, the die 12 is attached to the upper surface 101 of the substrate 10 by flip chip bonding. However, in other embodiment, the die 12 may be attached to the upper surface 101 of the substrate 10 by wire bonding, for example.

The package body 16 is disposed on the upper surface 101 of the substrate 10 so as to encapsulate the die 12 and the passive element 14. The package body 16 has an upper surface 161 and at least one side surface 162. In this embodiment, a part of the die 12 is exposed from the upper surface 161 of the package body 16, and the backside surface 122 of the die 12 is substantially coplanar with the upper surface 161 of the package body 16. In addition, the side surface 162 of the package body 16 is substantially coplanar with the lateral surface 103 of the substrate 10.

With continued reference to FIG. 1A, the second metal layer 20 is disposed on the first metal layer 18 and the lateral surface 103 of the substrate 10. In this embodiment, the second metal layer 20 has a top portion 22 disposed on the first metal layer 18 and a side portion 24 disposed on both the side surface 162 of the package body 16 and the lateral surface 103 of the substrate 10, wherein the side portion 24 of the second metal layer 20 contacts the grounding segment 107 for ground connection. Since the second metal layer 20 completely covers the semiconductor package 1 and connects to ground potential through the grounding segment 107, the second metal layer 20 can provide good electromagnetic shielding. The material of the second metal layer 20 may be, for example, Cu, Ag, Ni, Nanotube, Ti, Zn, Cr, stainless steel or any combination thereof, and may be the same as or different from the material of the first metal layer 18. Chromium, zinc and nickel serve to protect the first metal layer 18 from getting rusty, and the electromagnetic interference shielding is further enhanced. The second metal layer 20 may be a single layer structure or a multi-layered structure. The thickness $T_{s1}$ of the top portion 22 is preferably about 4 μm, and the thickness $T_{s2}$ of the side portion 24 is preferably about 1-2 μm, thus the thickness $T_{s1}$ of the top portion 22 is slightly greater than the thickness $T_{s2}$ of the side portion 24. In this embodiment, the thickness $T_{f1}$ of the first metal layer 18 is substantially greater than 5 times the thickness $T_{s1}$ of the top portion 22 or the thickness $T_{s2}$ of the side portion 24.

As illustrated in FIG. 1A, the peripheral metals (i.e. the first metal layer 18 and the second metal layer 20) form an outer metal cap 26 covering the package body 16 and the substrate 10. The outer metal cap 26 has a top portion 261 disposed on the upper surface 161 of the package body 16, an upper side portion 262 disposed on the side surface 162 of the package body 16 and a lower side portion 263 disposed on the lateral surface 103 of the substrate 10. In this embodiment, the top portion 261 of the outer metal cap 26 includes the first metal layer 18 and the top portion 22 of the second metal layer 20, thus the thickness $T_{o1}$ of the top portion 261 of the outer metal cap 26 is the sum of the thicknesses $T_{f1}$ and $T_{s1}$. The upper side portion 262 and the lower side portion 263 of the outer metal cap 26 include only the side portion 24 of the second metal layer 20. Thus, the thickness $T_{o2}$ of the upper side portion 262 is substantially equal to the thickness $T_{o3}$ of the lower side portion 263, and both are substantially equal to the thickness $T_{s2}$ of the side portion 24. Therefore, the thickness $T_{o1}$ of the top portion 261 of the outer metal cap 26 is substantially greater than 5 times the thickness $T_{o3}$ of the lower side portion 263 of the outer metal cap 26. In this embodiment, the thickness $T_{o1}$ is greater than 30 times the thickness $T_{o3}$. The outer metal cap 26 covers the whole semiconductor package 1 and directly contacts the backside surface 122 of the die 12, and accordingly the outer metal cap 26 provides both the functions of thermal dissipation and conformal EMI shielding.

Figure 1B:
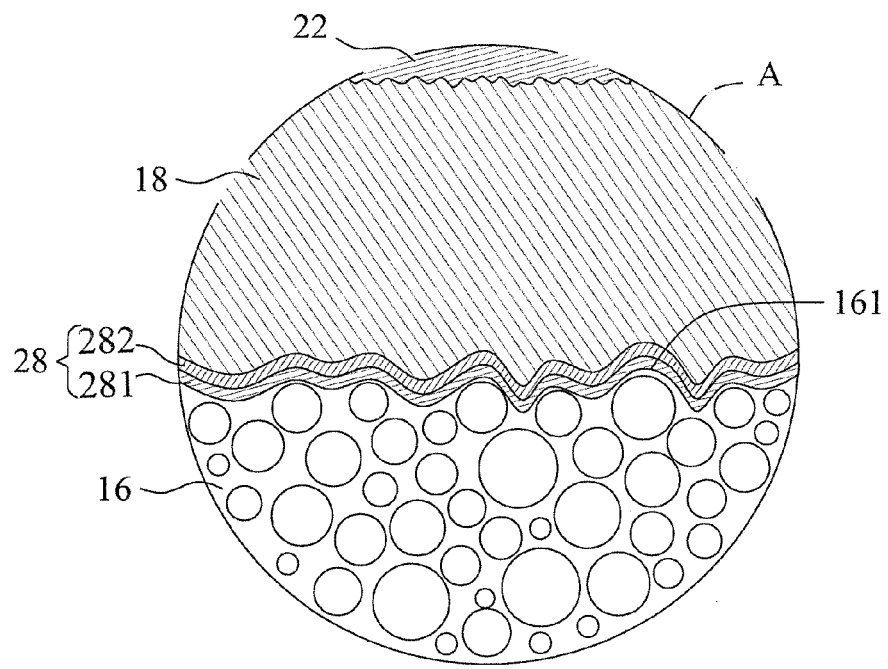
FIG. 1B is a detail view of the area A of FIG. 1A.

FIG. 1B is an enlarged detail view of the area A of the semiconductor package 1. With reference to FIG. 1B, a seed layer 28 is disposed on the upper surface 161 of the package body 16 and contacts the backside surface 122 of the die 12. The first metal layer 18 is disposed on the seed layer 28. Further, the upper surface 161 of the package body 16 is rough, and the seed layer 28 is disposed between the package body 16 and the first metal layer 18 to strengthen the adhesion between the package body 16 and the first metal layer 18. The material of the first metal layer 18 may be, for example, Cu, Ag, Ni, Nanotube, Ti, stainless steel or any combination thereof, and the thickness $T_{f1}$ of the first metal layer 18 is preferably about 30-100 μm, and more preferably about 30-60 μm. The first metal layer 18 may be a single layer structure or a multi-layered structure.

As illustrated in FIG. 1B, the seed layer 28 includes at least a first portion 281 and a second portion 282, wherein the first portion 281 overlies the upper surface 161 of the package body 16 and the second portion 282 overlies the first portion 281. To smoothly and completely cover the package body 16 and the backside surface 122 of the die 12, the first portion 281 may be selected from the group consisting of stainless steel and titanium, and may be formed by sputtering, electroplating, spray coating or any combination thereof. To provide close contact between the first metal layer 18 and the first portion 281, the second portion 282 may be the same material as the first metal layer 18, and may be formed by sputtering, electroplating, spray coating or any combination thereof. The material of the first portion 281 is different from that of the second portion 282. Preferably, the first portion 281 and the second portion 282 are formed by sputtering to a thickness of 10-50 nm and 3-10 μm, respectively. In contrast, a conventional heat sink, which is typically a metal plate or base, may not fully contact the upper surface 161 of the package body 16. Accordingly, the first metal layer 18 of the present embodiments can provide better thermal dissipation for the semiconductor package 1, since the contact area between the first metal later 18 and the package body 16 is increased through the seed layer 28.

Figure 2:
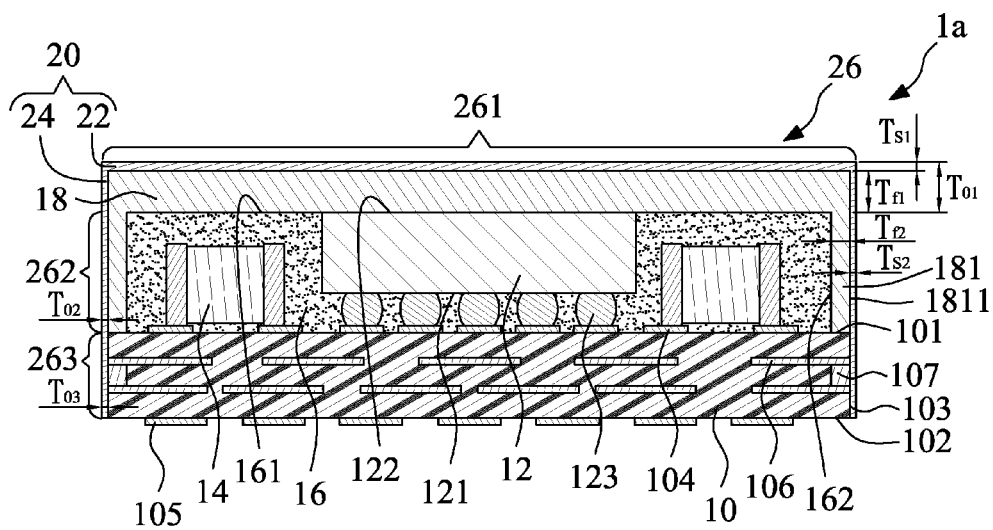
FIG. 2 is a cross-sectional view of a semiconductor package according to another of the present embodiments.

Referring to FIG. 2, a cross-sectional view of a semiconductor package according to another of the present embodiments is illustrated. The semiconductor package 1a of this embodiment is similar to the semiconductor package 1 of FIG. 1, and the same elements are designated with the same reference numerals. In this embodiment, the first metal layer 18 of the semiconductor package 1a further has an extending portion 181. The extending portion 181 is disposed on the side surface 162 of the package body 16 and contacts the upper surface 101 of the substrate 10, further enhancing the ability of the first metal layer 18 to dissipate heat from the die 12 by carrying the heat downward to the substrate 10.

The extending portion 181 may also enhance the EMI shielding capability of the first metal layer 18. In this embodiment, the extending portion 181 of the first metal layer 18 has an outer surface 1811 that is coplanar with the lateral surface 103 of the substrate 10, and the side portion 24 of the second metal layer 20 does not contact the side surface 162 of the package body 16.

As illustrated in FIG. 2, the upper side portion 262 of the outer metal cap 26 includes the extending portion 181 of the first metal layer 18 and the side portion 24 of the second metal layer 20. Thus, the thickness $T_{o2}$ of the upper side portion 262 of the outer metal cap 26 is the sum of the thickness $T_{f2}$ and the thickness $T_{s2}$. In this embodiment, the thickness $T_{f2}$ of the extending portion 181 is preferably about 10-60 μm, which is slightly less than the thickness $T_{f1}$ of the first metal layer 18. Therefore, the thickness $T_{o1}$ of the top portion 261 of the outer metal cap 26 is greater than the thickness $T_{o2}$ of the upper side portion 262 of the outer metal cap 26, and the thickness $T_{o2}$ of the upper side portion 262 of the outer metal cap 26 is greater than the thickness $T_{o3}$ of the lower side portion 263 of the outer metal cap 26. Thus, the outer metal cap 26 has three different thicknesses, which are, respectively, $T_{o1}$, $T_{o2}$, and $T_{o3}$.

Figure 3:
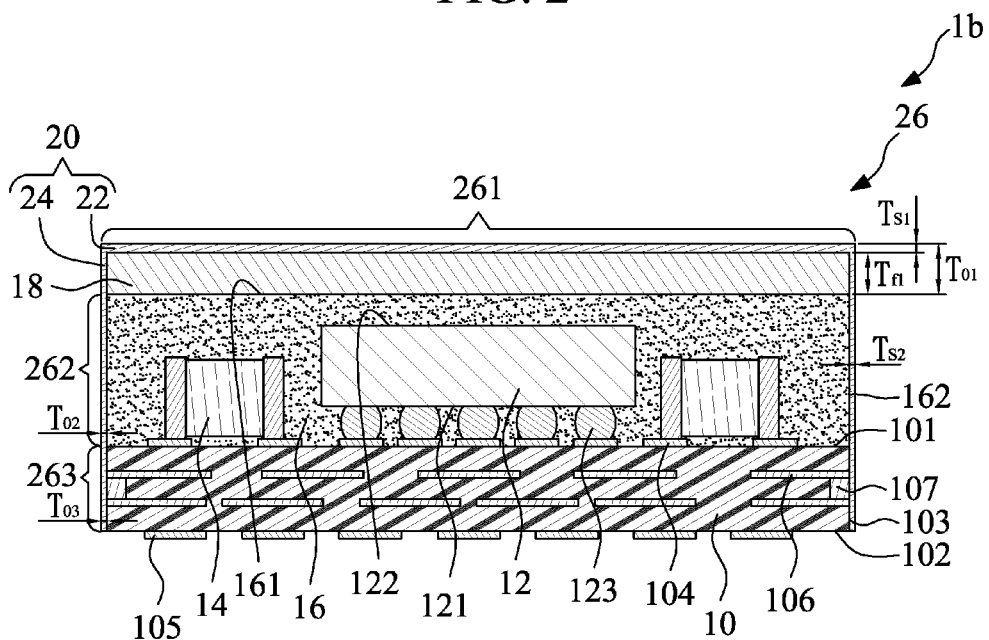
FIG. 3 is a cross-sectional view of a semiconductor package according to another of the present embodiments.

Referring to FIG. 3, a cross-sectional view of a semiconductor package according to another of the present embodiments is illustrated. The semiconductor package 1b of this embodiment is similar to the semiconductor package 1 of FIG. 1A, and the same elements are designated with the same reference numerals. As illustrated in FIG. 3, the package body 16 covers the backside surface 122 of the die 12. Thus, the backside surface 122 of the die 12 is not coplanar with the upper surface 161 of the package body 16, and the first metal layer 18 does not contact the backside surface 122 of the die 12.

Below, Table I illustrates results of a thermal simulation of different types of semiconductor packages, wherein the maximum junction temperature of the die 12 and the thermal resistance of the die 12 to ambient are listed. In Table I, Type 1 is a semiconductor package similar to the semiconductor package 1b of FIG. 3, but without the outer metal cap 26 (i.e., the first metal 18 layer and the second metal layer 20). Type 2 is another semiconductor package similar to Type 1 in which the package body is covered with the second metal layer only. Type 3 is another semiconductor package similar to Type 1 in which the upper surface of the package body is covered with the first metal layer only. Type 4 is the semiconductor package 1 of FIG. 1A. Type 5 is the semiconductor package 1a of FIG. 2. Finally, Type 6 is the semiconductor package 1b of FIG. 3.

The simulation conditions are as follows. The die is 1×1 mm and has 9 copper pillars, each with a height of 80 μm, a diameter of 80 μm, and a height of the solder on the copper pillar is 30 μm. The power consumption is 1 W. The substrate 10 is 3×3 mm and has a thickness of 300 μm. The thickness of the first metal layer 18 is 100 μm, and the thickness of the extending portion 181 (in Type 5) of the first metal layer 18 is 60 μm. The thickness of the top portion of the second metal layer 20 is 4 μm, and the thickness of the side portion of the second metal layer 20 is 1 μm. The thickness of the package body is 0.7 mm, and the gap between the upper surface 161 of the package body 16 and the backside surface 122 of the die 12 is 150 μm (in Types 1-4).

TABLE I

|  | Maximum Junction Temperature (° C.) | Thermal Resistance, Theta JA (° C./W) |
| --- | --- | --- |
| Type 1 | 143.23 | 118.23 |
| Type 2 | 143.25 | 118.25 |
| Type 3 | 132.41 | 107.41 |
| Type 4 | 119.98 | 94.98 |
| Type 5 | 101.23 | 76.23 |
| Type 6 | 132.38 | 107.38 |

As illustrated in Table I, the Type 4-6 semiconductor packages of the present embodiments have reduced maximum junction temperatures and the thermal resistances compared with the Type 1-3 semiconductor packages. In particular, the maximum junction temperature and the thermal resistance of the Types 4 and 5 semiconductor packages are reduced significantly, since the first metal layer 18 directly contacts the backside surface 122 of the die 12 in these embodiments.

Below, Table II illustrates results of a thermal simulation of different thicknesses of the first metal layer 18 of the semiconductor package 1 of FIG. 1A. In Table II, the Type 4 is a semiconductor package in which the thickness of the first metal layer 18 is 100 μm. Type 4a is a semiconductor package in which the thickness of the first metal layer 18 is 60 μm. Type 4b is a semiconductor package in which the thickness of the first metal layer 18 is 30 μm. Type 4c is a semiconductor package in which the thickness of the first metal layer 18 is 10 μm. Finally, the Type 4d is a semiconductor package without the first metal layer 18.

TABLE II

|  | Maximum Junction Temperature (° C.) | Thermal Resistance, Theta JA (° C./W) |
| --- | --- | --- |
| Type 4 | 119.98 | 94.98 |
| Type 4a | 120.57 | 95.57 |
| Type 4b | 121.84 | 96.84 |
| Type 4c | 125.47 | 100.47 |
| Type 4d | 146.74 | 121.74 |

As illustrated in Table II, the maximum junction temperature and the thermal resistance rise as the thickness of the first metal layer decreases. But, the rate of the rise decreases as the thickness increases. Thus, there is a range that has been found to be optimal when balancing the considerations of performance vs. material cost and fabrication time. Results have shown that little further improvement is possible beyond a thickness of the first metal layer 18 of 60 μm. Thus, the thickness of the first metal layer 18 is preferably about 30-60 μm.

Table III illustrates results of a thermal simulation of different thicknesses of the first metal layer 18 of the semiconductor package 1a of FIG. 2. In Table III, Type 5 is a semiconductor package in which the thickness of the first metal layer is 100 μm. Type 5a is a semiconductor package in which the thickness of the first metal layer is 60 μm. Type 5b is a semiconductor package in which the thickness of the first metal layer is 30 μm. Type 5c is a semiconductor package in which the thickness of the first metal layer is 10 μm.

TABLE III

| | Maximum Junction Temperature (° C.) | Thermal Resistance, Theta JA (° C./W) |
|---|---|---|
| Type 5 | 101.23 | 76.23 |
| Type 5a | 105.71 | 80.71 |
| Type 5b | 111.02 | 86.02 |
| Type 5c | 119.45 | 94.45 |

As illustrated in Table III, the maximum junction temperature and the thermal resistance rise as the thickness of the first metal layer decreases. The maximum junction temperature and the thermal resistance are further improved compared to the semiconductor packages of Tables 1 and 2, due to the extending portions 181, which enhance the ability of the first metal layer 18 to dissipate heat from the die 12 by carrying the heat downward to the substrate 10.

Figure 4:
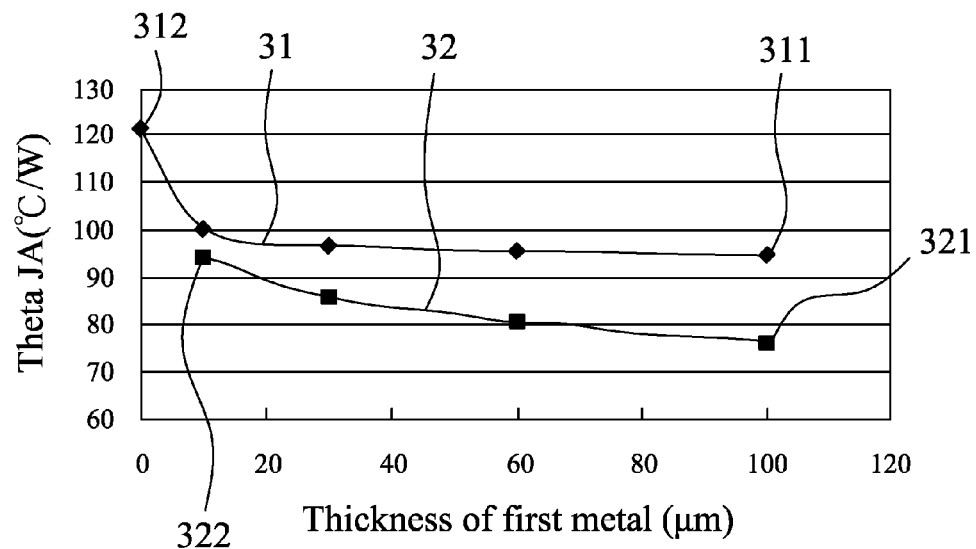
FIG. 4 is a diagram of the thermal resistance from Tables 2 and 3 below.

FIG. 4 illustrates the thermal resistance as a function of thickness according to Tables 2 and 3, wherein the curve 31 designates Table II, and the curve 32 designates Table III. As illustrated by the curve 31, the inclusion of the first metal layer 18 in the semiconductor package 1 of FIG. 1A efficiently reduces the thermal resistance. The first metal layer 18 with a thickness of 100 μm (Type 4, point 311) achieves about a 20% reduction in the thermal resistance as compared to Type 4d (point 312). As illustrated by the curve 32, the thermal resistances of the Types 5-5c are lower than those of the Types 4-4d. The first metal layer with a thickness of 100 μm (Type 5, point 321) achieves about a 30% reduction in the thermal resistance as compared to Type 4d (point 322). Therefore, the outer metal cap 26 (i.e. the first metal layer 18 and the second metal layer 20) improves heat dissipation of the semiconductor package in addition to providing good EMI shielding.

Figure 5:
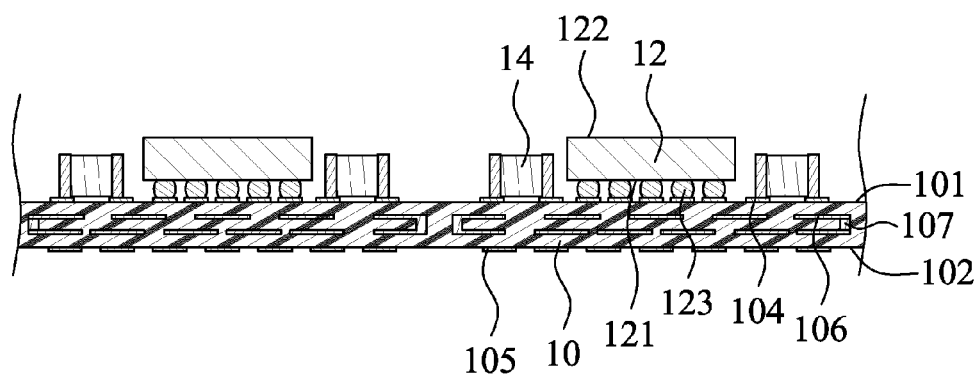
FIGS. 5-8 are cross-sectional side views of steps in a process of making the semiconductor package of FIG. 1.

FIGS. 5-8 illustrate a method for making the semiconductor package of FIG. 1A. Referring to FIG. 5, a substrate 10 is provided. The substrate 10 has an upper surface 101, a lower surface 102, a plurality of upper pads 104, a plurality of lower pads 105, a plurality of circuit layers 106 and at least one grounding segment 107. The lower surface 102 is opposite the upper surface 101. The upper pads 104 are disposed on the upper surface 101, and the lower pads 105 are disposed on the lower surface 102. The circuit layers 106 are disposed inside the substrate 10, and the grounding segment 107 electrically connects to a ground potential.

A plurality of dies 12 and passive elements 14 are attached to the upper pads 104 on the upper surface 101 of the substrate 10. In this embodiment, the die 12 has an active surface 121, a backside surface 122, and a plurality of bumps 123 disposed on the active surface 121. The die 12 is attached to the upper surface 101 of the substrate 10 by flip chip bonding. Thus, the bumps 123 are connected to the upper pads 104. However, in other embodiments the die 12 may be attached to the upper surface 101 of the substrate 10 by wire bonding, for example.

Figure 6:
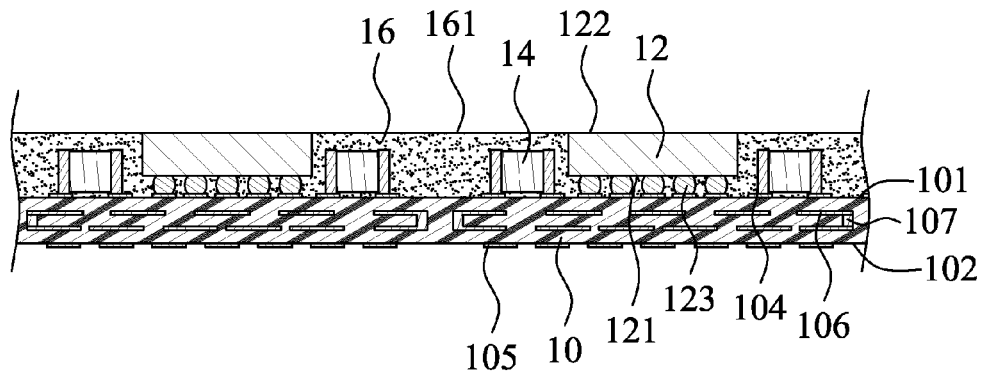

Referring to FIG. 6, a package body 16 is formed on the upper surface 101 of the substrate 10 to encapsulate the dies 12 and passive elements 14, wherein the package body 16 has an upper surface 161. In this embodiment, the thickness of the package body 16 is tightly controlled so that the die 12 exposed from the package body 16, and the backside surface 122 of the die 12 is coplanar with the upper surface 161 of the package body 16. The package body 16 may be formed by compression molding, injection molding, transfer molding, or any other process. Next, a seed layer including a first portion and a second portion is formed on the upper surface 161 of the package body 16. The seed layer may be formed by electroplating, spray coating, foil attaching, vaporizing, sputtering, printing or any combination thereof, or any other process.

Figure 7:
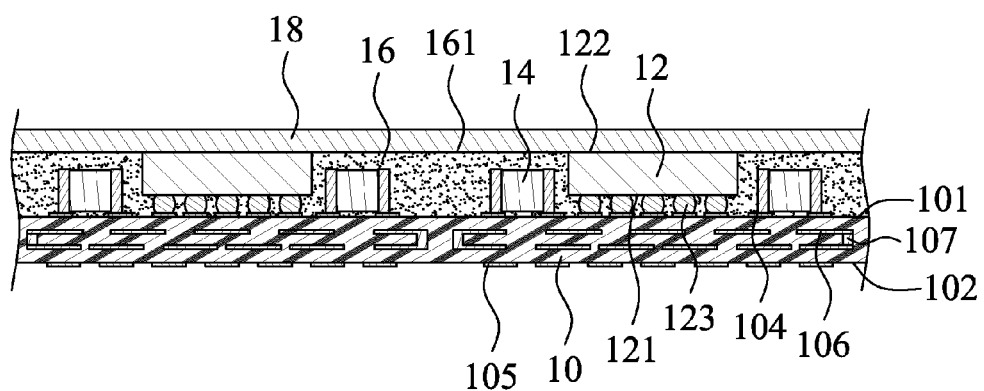

Referring to FIG. 7, a first metal layer 18 is formed on the package body 16 and the backside surface 122 of the die 12. In this embodiment, the first metal layer 18 directly contacts the backside surface 122 of the die 12. Thus, it can provide good thermal dissipation for the die 12. The material of the first metal layer 18 may be, for example, Cu, Ag, Ni, Nanotube, Ti, stainless steel or any combination thereof. The first metal layer 18 may be, for example, formed by electroplating, spray coating, foil attaching, vaporizing, sputtering, printing or any combination thereof. The first metal layer 18 may be a single layer structure or a multi-layered structure with different materials formed by the process illustrated above or any other process. In order to reduce the time required for forming the first metal layer 18, the first metal layer 18 may be formed by electroplating to a thickness of at most 100 μm.

Figure 8:
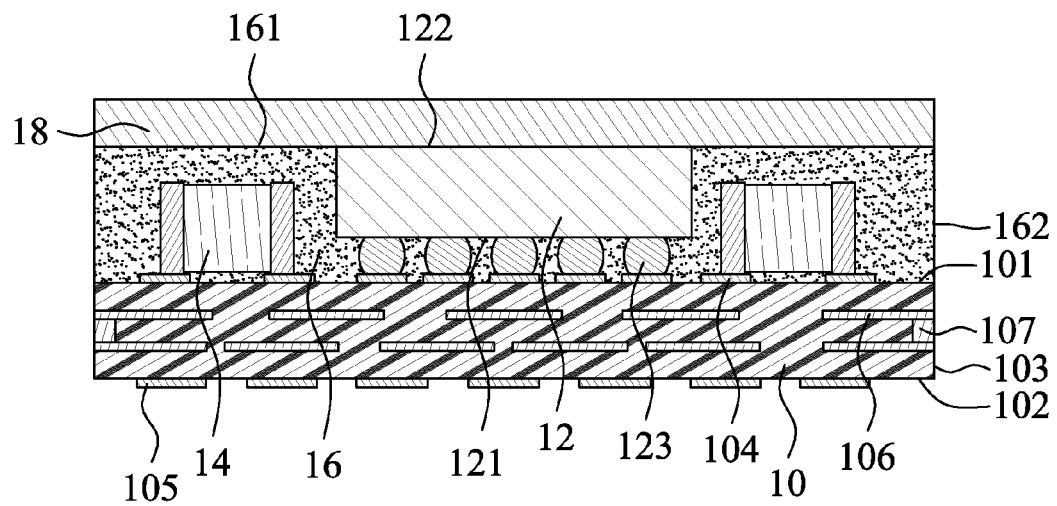

Referring to FIG. 8, a singulation process is performed to form a plurality of package units. In various embodiments, the substrate 10, the package body 16 and the first metal layer 18 may be cut by a laser or a blade, for example. In the package unit, the substrate 10 has at least one lateral surface 103, the package body 16 has at least one side surface 162, and the side surface 162 of the package body 16 is coplanar with the lateral surface 103 of the substrate 10. In addition, the interconnection metal 107 is exposed from the lateral surface 103 of the substrate 10.

Subsequently, a second metal layer 20 is formed on the first metal layer 18, the side surface 162 of the package body 16 and the lateral surface 103 of the substrate 10 of the package unit, so as to obtain the semiconductor package 1 of FIG. 1A. In addition, the second metal layer 20 contacts the exposed grounding segment 107 for ground connection, so that the second metal layer 20 can provide good EMI shielding. The material of the second metal layer 20 may be, for example, Cu, Ag, Ni, Nanotube, Ti, stainless steel or any combination thereof, and may be the same as or different from the material of the first metal layer 18. The second metal layer 20 may be a single layer structure or a multi-layered structure. The second metal layer 20 may be formed by electroplating, spray coating, foil attaching, vaporizing, sputtering, printing or any combination thereof, for example. In order to efficiently cover the first metal layer 18, the side surface 162 of the package body 16 and the lateral surface 103 of the substrate 10, the second metal layer 20 may be formed by sputtering to a thickness of at most 4 μm. Meanwhile, the peripheral metals (i.e. the first metal layer 18 and the second metal layer 20) form the outer metal cap 26 covering the package body 16 and the substrate 10.

Figure 9:
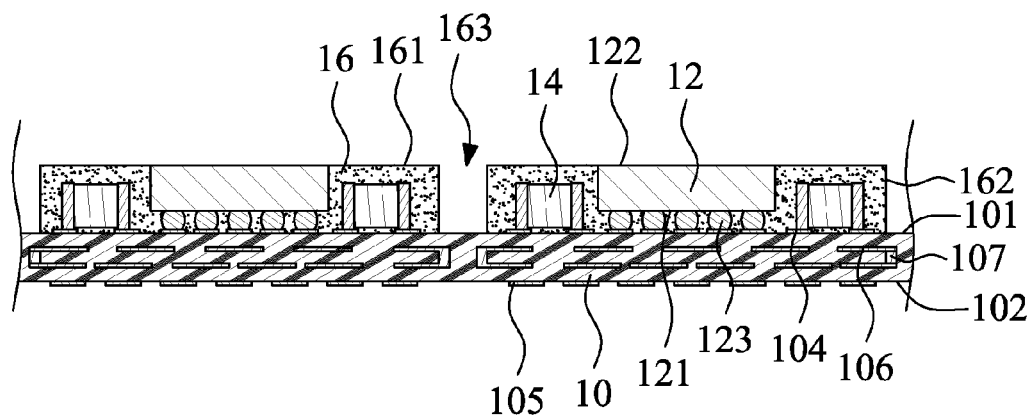
FIGS. 9-11 are cross-sectional side views of steps in a process of making the semiconductor package of FIG. 2.
Figure 10:
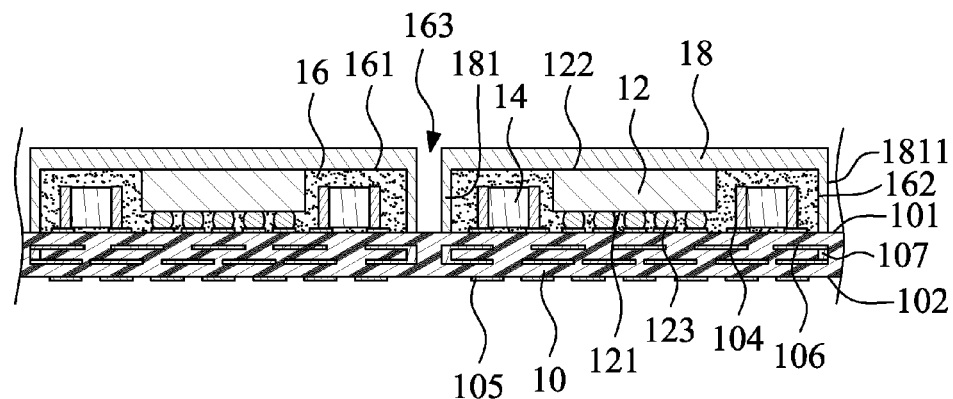
Figure 11:
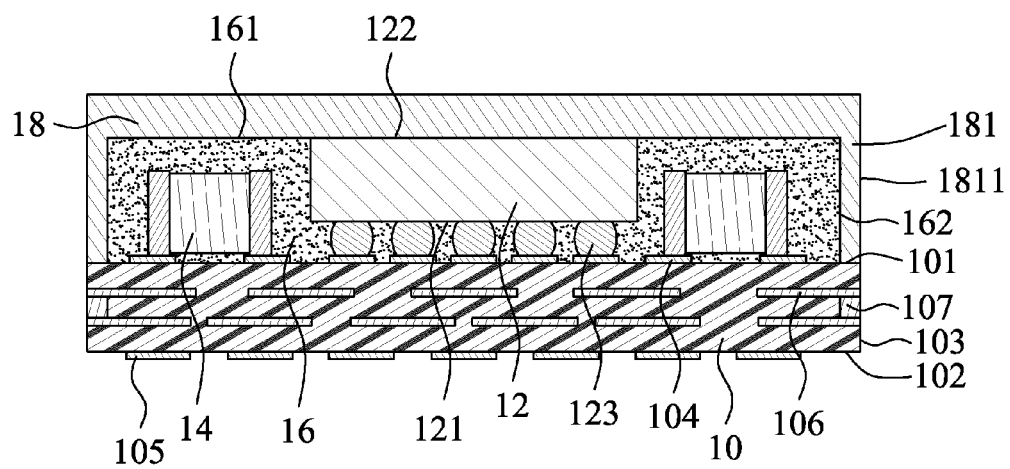

FIGS. 9-11 illustrate a method for making the semiconductor package of FIG. 2. The initial steps of the process of this embodiment are the same as the steps of FIGS. 5-6. Referring to FIG. 9, a half cutting process on the package body 16 using, for example, a laser or a blade, forms a plurality of grooves 163. The substrate 10 is not cut, so that the grooves 163 penetrate the package body 16 to expose portions of the upper surface 101 of the substrate 10. Meanwhile, the side surface 162 of the package body 16 is formed.

Referring to FIG. 10, the first metal layer 18 is formed on the package body 16. In this embodiment, the first metal layer 18 has an extending portion 181, wherein the extending portion 181 is formed in the grooves 163 of the package body 16 and contacts the upper surface 101 of the substrate 10. The extending portion 181 and the first metal layer 18 are formed by the same process, but the thickness of the extending portion 181 is slightly less than the thickness of the first metal layer 18.

Referring to FIG. 11, a singulation process is performed to form a plurality of package units. In this embodiment, only the substrate 10 is cut. In each package unit, the substrate 10 has at least one lateral surface 103 coplanar with the outer surface 1811 of the extending portion 181 of the first metal layer 18. Then, the second metal layer 20 is formed on the first metal layer 18, the outer surface 1811 of the extending portion 181, and the lateral surface 103 of the substrate 10 of the package unit, so as to obtain the semiconductor package 1a of FIG. 2. The side portion 24 of the second metal layer 20 does not contact the side surface 162 of the package body 16, due to the presence of the extending portion 181.

Figure 12:
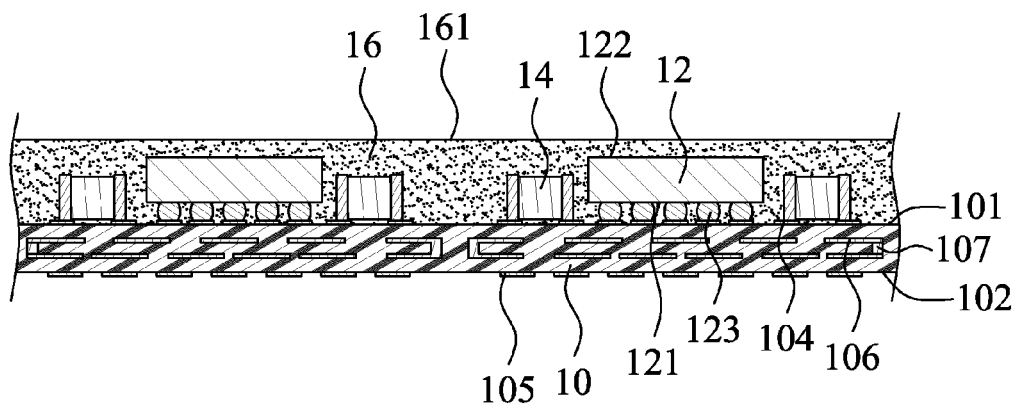
FIGS. 12-14 are cross-sectional side views of steps in a process of making the semiconductor package of FIG. 3.
Figure 13:
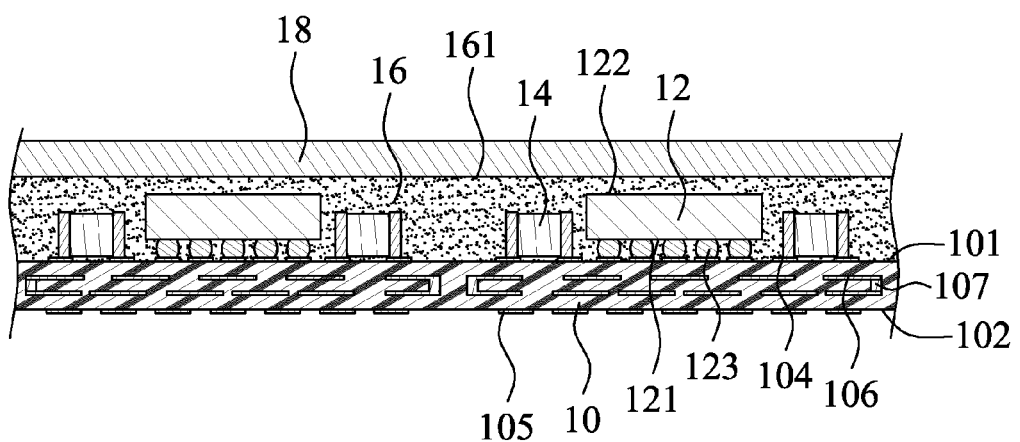
Figure 14:
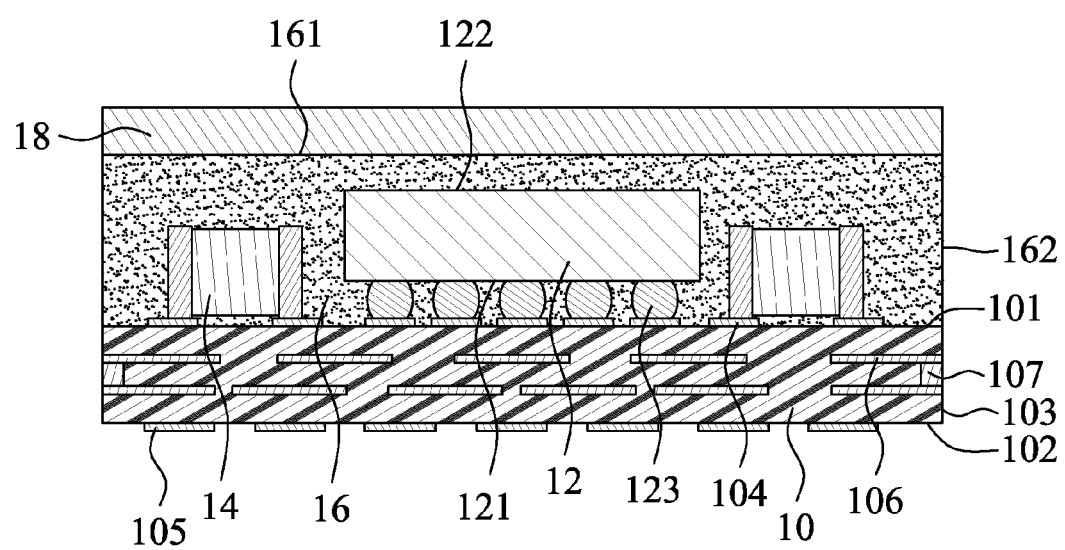

FIGS. 12-14 illustrate a method for making the semiconductor package of FIG. 3. The initial steps of the process of this embodiment are the same as the steps of FIG. 5. Referring to FIG. 12, the package body 16 is formed on the upper surface 101 of the substrate 10 to completely encapsulate the dies 12 and the passive elements 14. The thickness of the package body 16 is tightly controlled so that the die 12 is not exposed from the package body 16, and the backside surface 122 of the die 12 is not coplanar with the upper surface 161 of the package body 16 after the molding process. Referring to FIG. 13, the first metal layer 18 is formed on the package body 16. In this embodiment, the first metal layer 18 does not contact the backside surface 122 of the die 12.

Referring to FIG. 14, a singulation process is performed to form a plurality of package units. In this embodiment, the substrate 10, the package body 16 and the first metal layer 18 may be cut by a laser or a blade, for example. Accordingly, at least one lateral surface 103 of the substrate 10 and at least one side surface 162 of the package body 16 are formed, and the side surface 162 of the package body 16 is coplanar with the lateral surface 103 of the substrate 10. In addition, the grounding segment 107 is exposed from the lateral surface 103 of the substrate 10. Then, the second metal layer 20 is formed on the first metal layer 18, the side surface 162 of the package body 16 and the lateral surface 103 of the substrate 10 of the package unit, so as to obtain the semiconductor package 1b of FIG. 3.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the invention. Accordingly, unless specifically indicated herein, the order and grouping of the operations are not limitations of the invention.

What is claimed is:

1. A semiconductor package, comprising:
   a substrate having an upper surface and a lateral surface adjacent to a periphery of the substrate;
   a grounding segment disposed adjacent the periphery of the substrate;
   a die disposed adjacent to the upper surface of the substrate, wherein the die has an active surface and a backside surface opposite the active surface;
   a package body disposed on the upper surface of the substrate and at least partially encapsulating the die, wherein the package body has an upper surface and at least one side surface, and wherein the backside surface of the die is exposed from the upper surface of the package body;
   a heat dissipation layer disposed on the upper surface of the package body and the backside surface of the die, wherein the heat dissipation layer has an extending portion disposed on the at least one side surface of the package body and having an end surface contacting the upper surface of the substrate, and wherein the extending portion of the heat dissipation layer has an outer surface coplanar with the lateral surface of the substrate; and
   a shielding layer disposed over the heat dissipation layer and in contact with the lateral surface of the substrate, and electrically connected to the grounding segment.

2. The semiconductor package of claim 1, wherein the backside surface of the die is substantially coplanar with the upper surface of the package body.

3. The semiconductor package of claim 1, wherein the thickness of the heat dissipation layer is greater than that of the shielding layer.

4. The semiconductor package of claim 1, further comprising a seed layer disposed between the package body and the heat dissipation layer, wherein the seed layer has a first portion disposed on the upper surface of the package body, and a second portion disposed on the first portion, and the material of the first portion is different from that of the second portion.

5. A semiconductor package, comprising:
   a substrate having an upper surface and a lateral surface adjacent to a periphery of the substrate;
   a die disposed adjacent to the upper surface of the substrate;
   a package body disposed on the upper surface of the substrate and at least partially encapsulating the die, wherein the package body has an upper surface and a part of the die is exposed from the upper surface of the package body;
   a heat dissipation layer disposed over the package body and the die;
   a seed layer disposed between the package body and the heat dissipation layer, wherein the seed layer has a first portion disposed on the upper surface of the package body, and a second portion disposed on the first portion, and the material of the first portion is different from that of the second portion; and
   a shielding layer having a top portion disposed on the heat dissipation layer and a side portion disposed on the lateral surface of the substrate.

6. The semiconductor package of claim 5, wherein the backside surface of the die is substantially coplanar with the upper surface of the package body.

7. The semiconductor package of claim 5, wherein the thickness of the heat dissipation layer is greater than that of the shielding layer.

8. The semiconductor package of claim 5, wherein a thickness of the heat dissipation layer is at least five times greater than a thickness of the top portion of the shielding layer.

9. The semiconductor package of claim 5, wherein a thickness of the heat dissipation layer is 30-60 µm.

10. The semiconductor package of claim 5, wherein the package body has at least one side surface, and the heat dissipation layer has an extending portion disposed on the at least one side surface of the package body and contacting the upper surface of the substrate.

11. The semiconductor package of claim 10, wherein the extending portion of the heat dissipation layer has an outer surface coplanar with the lateral surface of the substrate.

12. A semiconductor package, comprising:
a substrate having an upper surface and a lateral surface adjacent to a periphery of the substrate;
a grounding segment disposed adjacent the periphery of the substrate;
a die disposed adjacent to the upper surface of the substrate, wherein the die has an active surface and a backside surface opposite the active surface;
a package body disposed on the upper surface of the substrate and at least partially encapsulating the die, wherein the package body has an upper surface and at least one side surface, and wherein the backside surface of the die is exposed from the upper surface of the package body; and
a shielding cap including a top portion and a side portion contacting the top portion, wherein the top portion disposes on the upper surface of the package body and the backside surface of the die, the side portion disposes on the at least one side surface of the package body, a portion of the upper surface and the lateral surface of the substrate and electrically connects to the grounding segment, and the side portion is in contact with the portion of the upper surface and the lateral surface of the substrate.

13. The semiconductor package of claim 12, wherein the backside surface of the die is substantially coplanar with the upper surface of the package body.

14. The semiconductor package of claim 12, wherein the thickness of the top portion of the shielding cap is greater than that of the side portion of the shielding cap.

15. The semiconductor package of claim 12, further comprising a seed layer disposed between the package body and the shielding cap, wherein the seed layer has a first portion disposed on the upper surface of the package body, and a second portion disposed on the first portion, and the material of the first portion is different from that of the second portion.

16. A semiconductor package, comprising:
a substrate having an upper surface, and a lateral surface adjacent to a periphery of the substrate;
a die disposed adjacent to the upper surface of the substrate, wherein the die has an active surface and a backside surface opposite the active surface;
a package body disposed on the upper surface of the substrate and at least partially encapsulating the die, wherein the package body has an upper surface and a part of the die is exposed from the upper surface of the package body; and
a shielding cap including a top portion and a side portion contacting the top portion, the top portion includes a heat dissipation layer disposed on the upper surface of the package body and the backside surface of the die, and a shielding layer disposed on the heat dissipation layer; wherein the side portion is disposed on and is in contact with the lateral surface of the substrate; wherein the backside surface of the die is substantially coplanar with the upper surface of the package body; and wherein the heat dissipation layer has an extending portion disposed on at least one side surface of the package body and having an end surface contacting the upper surface of the substrate.

17. The semiconductor package of claim 16, wherein a thickness of the heat dissipation layer is at least five times greater than a thickness of the shielding layer.

18. The semiconductor package of claim 16, wherein a thickness of the heat dissipation layer is 30-60 µm.

19. The semiconductor package of claim 16, further comprising a grounding segment disposed adjacent the periphery of the substrate.

20. The semiconductor package of claim 1, wherein a maximum junction temperature and a thermal resistance rises as thickness of the heat dissipation layer decreases for dissipating heat from the die towards the substrate.

21. The semiconductor package of claim 5, wherein a maximum junction temperature and a thermal resistance rises as thickness of the heat dissipation layer decreases for dissipating heat from the die towards the substrate.

22. The semiconductor package of claim 12, further comprising a heat dissipation layer disposed over the package body and the die, wherein a maximum junction temperature and a thermal resistance rises as thickness of the heat dissipation layer decreases for dissipating heat from the die towards the substrate.

23. The semiconductor package of claim 16, wherein a maximum junction temperature and a thermal resistance rises as thickness of the heat dissipation layer decreases for dissipating heat from the die towards the substrate.

* * * * *